United States Patent
Yamamoto

(10) Patent No.: US 7,898,860 B2
(45) Date of Patent: Mar. 1, 2011

(54) SEMICONDUCTOR MEMORY DEVICE AND METHOD OF CONTROLLING SEMICONDUCTOR MEMORY DEVICE

(75) Inventor: Shinichi Yamamoto, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/543,035

(22) Filed: Aug. 18, 2009

(65) Prior Publication Data

US 2009/0303805 A1      Dec. 10, 2009

Related U.S. Application Data

(60) Division of application No. 11/790,974, filed on Apr. 30, 2007, now Pat. No. 7,596,025, which is a continuation of application No. 11/067,976, filed on Mar. 1, 2005, now Pat. No. 7,224,606.

(30) Foreign Application Priority Data

Oct. 21, 2004      (JP) ................................ 2004-307136

(51) Int. Cl.
    *G11C 16/04*      (2006.01)
(52) U.S. Cl. .................................. 365/185.11
(58) Field of Classification Search .............. 365/185.11
    See application file for complete search history.

(56) References Cited

U.S. PATENT DOCUMENTS

| | | | | |
|---|---|---|---|---|
| 6,237,110 | B1* | 5/2001 | Lin et al. | 714/7 |
| 6,446,177 | B1* | 9/2002 | Tanaka et al. | 711/163 |
| 6,510,090 | B1* | 1/2003 | Chida | 365/195 |
| 2003/0070025 | A1 | 4/2003 | Watts et al. | |
| 2004/0010773 | A1 | 1/2004 | Chan et al. | |
| 2005/0002238 | A1 | 1/2005 | Miki | |

FOREIGN PATENT DOCUMENTS

| | | |
|---|---|---|
| JP | 63187498 A | 8/1988 |
| JP | 3214498 A | 9/1991 |
| JP | 8045293 A | 2/1996 |
| JP | 8221994 A | 8/1996 |
| JP | 10320984 A | 12/1998 |
| JP | 2002-83872 | 3/2002 |
| JP | 2002-118187 A | 4/2002 |

* cited by examiner

*Primary Examiner* — Hoai V Ho
*Assistant Examiner* — Anthan T Tran
(74) *Attorney, Agent, or Firm* — Arent Fox LLP

(57) ABSTRACT

A semiconductor memory device has a nonvolatile memory cell to which data writing operation is limited to a predetermined logic value. In the case of rewriting data "10101010" written in a first memory core to data "01010101", since the data writing operation includes writing of a logic value "1" opposite to the predetermined logic value, an erasing operation is needed and the data writing is regulated. By rewriting a pointer value stored in a pointer memory in place of performing the erasing operation, an operation of switching a memory core to be selected to a second memory core (data "11111111") is performed. Data is newly written into the second memory core selected by the rewritten pointer value.

2 Claims, 5 Drawing Sheets

DIAGRAM SHOWING SEMICONDUCTOR MEMORY DEVICE 1 ACCORDING TO FIRST EMBODIMENT

FIG. 1 DIAGRAM SHOWING SEMICONDUCTOR MEMORY DEVICE 1 ACCORDING TO FIRST EMBODIMENT

FIG. 2 DIAGRAM SHOWING SEMICONDUCTOR MEMORY DEVICE 1a ACCORDING TO SECOND EMBODIMENT

FIG. 3 DIAGRAM SHOWING SEMICONDUCTOR MEMORY DEVICE 1b ACCORDING TO THIRD EMBODIMENT

DIAGRAM SHOWING OPERATION OF SEMICONDUCTOR MEMORY DEVICE 1b

| CH1 | P1 | P2 | P3 | S1 | S2 | S3 | S4 |
|---|---|---|---|---|---|---|---|
| 0 | 1 | 1 | 1 | H | L | L | L |
| 0 | 0 | 1 | 1 | L | H | L | L |
| 0 | 0 | 0 | 1 | L | L | H | L |
| 0 | 0 | 0 | 0 | L | L | L | H |
| 1 | 1 | x | x | H | H | L | L |
| 1 | 0 | x | x | L | L | H | H |

FIG. 5  DIAGRAM SHOWING DECODER 11b FOR POINTER

DIAGRAM SHOWING OPERATION OF DECODER 11b FOR POINTER

| CH2 | P1 | P2 | P3 | I1 | I2 | I3 | I4 | S1 | S2 | S3 | S4 |
|---|---|---|---|---|---|---|---|---|---|---|---|
| 0 | 1 | 1 | 1 | x | x | x | x | H | L | L | L |
| 0 | 0 | 1 | 1 | x | x | x | x | L | H | L | L |
| 0 | 0 | 0 | 1 | x | x | x | x | L | L | H | L |
| 0 | 0 | 0 | 0 | x | x | x | x | L | L | L | H |
| 1 | x | x | x | 1 | 0 | 0 | 0 | H | L | L | L |
| 1 | x | x | x | 0 | 1 | 0 | 0 | L | H | L | L |
| 1 | x | x | x | 0 | 0 | 1 | 0 | L | L | H | L |
| 1 | x | x | x | 0 | 0 | 0 | 1 | L | L | L | H |

INTERNAL BLOCK DIAGRAM OF NONVOLATILE SEMICONDUCTOR MEMORY DEVICE OF PRIOR ART

SEMICONDUCTOR MEMORY DEVICE AND METHOD OF CONTROLLING SEMICONDUCTOR MEMORY DEVICE

CROSS-REFERENCE TO RELATED APPLICATIONS

This application is a Divisional Application of application Ser. No. 11/790,974 which is a Continuation Application of application Ser. No. 11/067,976 which is based upon and claims the benefit of priority from prior Japanese Patent Application No. 2004-307136 filed on Oct. 21, 2004, the entire contents of which are incorporated herein by reference.

BACKGROUND OF THE INVENTION

1. Field of the Invention

The present invention relates to a nonvolatile semiconductor memory device and, more particularly, to a nonvolatile semiconductor memory device realizing reduction in its circuit size.

2. Description of Related Art

There are various semiconductor integrated circuits each having a nonvolatile semiconductor memory device for holding various setting values. FIG. 7 is an internal block diagram of a conventional nonvolatile semiconductor memory device. Each of word lines W1 to W4 constructing a memory array is connected to a negative voltage applying circuit NEG for applying negative voltage at the time of erasure. An erase voltage applying circuit ED applies positive voltage at the time of erasure and, in reading/writing operation, connects a common source line CS to the ground potential 0V of the circuit. Next, an erasing operation will be described. The erasing operation is formed by applying negative voltage to the control gate of a memory cell and positive voltage to the source and moving electrons held in a floating gate by the potential difference between the positive and negative voltages to the source region by Fowler-Nordheim tunnel emission. To the erase voltage applying circuit ED and negative voltage applying circuit NEG, power source voltage Vcc is supplied as an operating voltage.

As techniques related to the above, Japanese Patent Application Laid-open Nos. 2002-118187 and 2002-83872 are disclosed.

SUMMARY OF THE INVENTION

In the background arts, however, the negative voltage applying circuit NEG and erase voltage applying circuit ED for applying negative voltage at the time of erasure are necessary. The negative voltage applying circuit NEG has therein a capacitance, so that the circuit size is large. It is a problem that reduction in the circuit size of the nonvolatile semiconductor memory device is disturbed and power cannot be saved due to the negative voltage applying circuit NEG. In particular, the circuit size of a nonvolatile semiconductor memory device for storing a small amount of information such as a mode setting value of a microcomputer LSI, a clock frequency setting value of an LSI for a PLL (Phase-Locked Loop) is reduced since the number of memory cells may be small. In this case, the proportion of the area occupied by the negative voltage applying circuit in the whole circuit area of the nonvolatile semiconductor memory device is high. Consequently, the problem that the circuit size of the nonvolatile semiconductor memory device cannot be reduced becomes more serious.

The present invention has been achieved to solve at least one of the problems of the background arts and its object is to provide a nonvolatile semiconductor memory device realizing reduction in circuit size and reduction in power consumption.

To achieve the object, a semiconductor memory device according to a first invention includes: plural memory cores having nonvolatile memory cells in which data to be written is regulated to a predetermined logic value and each of which is to be independently subjected to access control; and a pointer having nonvolatile memory cells and selecting a memory core to be subjected to the access control.

The memory core has nonvolatile memory cells in which data to be written is regulated to a predetermined logic value and each of which is to be independently subjected to access control. An example of the nonvolatile memory cell in which data to be written is regulated to a predetermined logic is a cell to which only a predetermined logic value "0" can be written. More concretely, it is a flash memory cell or the like to which only a data writing operation from "1" to "0" can be performed but a writing operation from "0" to "1" cannot be performed. The pointer has nonvolatile memory cells. The pointer selects a memory core as an object of an access control. On the memory core selected by the pointer, the access control of the data reading operation, data writing operation, or the like is performed.

A case where data "1" as the logic value opposite to the predetermined logic value has to be written to a memory cell in which the logic value "0" is preliminarily written at the time of data writing will be described. In this case, since writing is regulated, it is sufficient to select another memory core in which the logic value "1" is written by the pointer. As data, it can be regarded that the logic value held in the memory core is rewritten from "0" to "1".

Consequently, while enabling a logic value opposite to a predetermined logic value to be falsely written as data, a circuit necessary to prevent the data writing operation from being regulated to the predetermined logic value (such as a circuit for an erasing operation in a flash memory) can be made unnecessary. Thus, the circuit for an erasing operation or the like occupying a large circuit area can be made unnecessary, so that reduction in the circuit size and reduction in power consumption of the semiconductor memory device can be achieved.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 5 is a diagram showing a decoder 11b for a pointer;

DETAILED DESCRIPTION OF THE PREFERRED EMBODIMENTS

Figure 1:
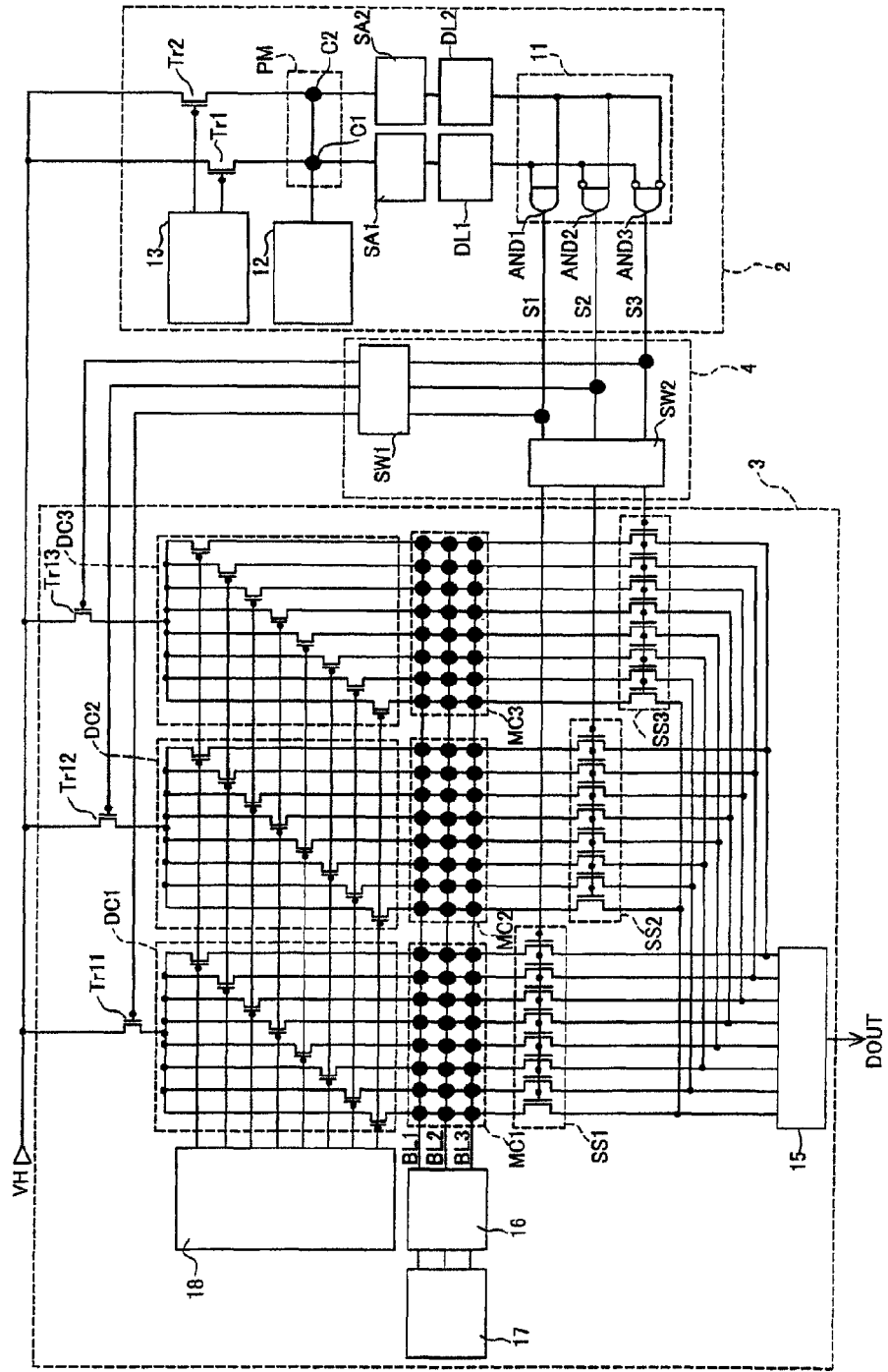
FIG. 1 is a diagram showing a semiconductor memory device 1 according to a first embodiment.

A semiconductor memory device of the invention and embodiments of the semiconductor memory device will be described in detail hereinbelow with reference to FIGS. 1 to 6. A first embodiment of the invention will be described by using FIG. 1. FIG. 1 shows a semiconductor memory device 1 according to the first embodiment. The semiconductor memory device 1 has a pointer 2, a memory cell unit 3, and a switch unit 4.

The pointer 2 has a pointer memory PM, a column selector 13 for pointer writing, a row driver 12 for the pointer, transistors Tr1 and Tr2, sense amplifiers SA1 and SA2, data latches DL1 and DL2, and a decoder 11 for the pointer. The pointer memory PM has flash memory cells C1 and C2 of the quantity corresponding to the number of bits (=the number of memory cores−1). The flash memory cell C1 is connected to a high voltage VH for writing via the transistor Tr1. The gate of the transistor Tr1 is connected to the column selector 13 for pointer writing. The flash memory cell C1 is connected to the row driver 12 for pointer and the sense amplifier SA1. The sense amplifier SA1 is connected to the decoder 11 for pointer via the data latch DL1. Selection signals S1 to S3 are output from AND gates AND1 to AND3 of the decoder 11 for pointer. The flash memory cell C2 is connected in a manner similar to the flash memory cell C1 so that the description will be omitted.

The memory cell unit 3 has transistors Tr11 to Tr13, a column selector 18 for writing a memory core, decoders DC1 to DC3 for writing, first to third memory cores MC1 to MC3, a row driver 17 for a memory core, a row selector 16 for a memory core, first to third selectors SS1 to SS3, and a sense amplifier 15 for reading. Word lines of the first to third memory cores MC1 to MC3 are connected to the row selector 16 for a memory core and the row driver 17 for a memory core. Each of bit lines of the first memory core MC1 is connected to the high voltage VH for writing via the decoder DC for writing and also to the sense amplifier 15 for reading via the first selector SS1. The read data DOUT is output from the sense amplifier 15 for reading. In the memory cores MC1 to MC3 and the pointer memory PM in FIG. 1, painted circles indicate flash memory cells. Since the second and third memory cores MC2 and MC3 have a connection structure similar to that of the first memory core MCI, the description will not be repeated.

The switch unit 4 has a write switch SW1 and a read switch SW2. The selection signals S1 to S3 output from the decoder 11 for pointer are input to the transistors Tr11 to Tr13, respectively, via the write switch SW1. The selection signals S1 to S3 are input to first to third selectors SS1 to SS3, respectively, via the read switch SW2.

The semiconductor memory device 1 according to the invention does not have a negative voltage circuit necessary for operation of erasing a flash memory cell. Therefore, on the flash memory cells C1 and C2 of the pointer memory PM and the flash memory cells of the first to third memory cores MC1 to MC3, only a programming operation (rewriting from the bit 1 to 0) can be performed and an erasing operation (rewriting from the bit 0 to 1) cannot be performed.

The operation of the semiconductor memory device 1 according to the first embodiment will be described. The semiconductor memory device 1 is an 8-bit memory and an example of a type which can be rewritten at least three times.

Attention is paid to a memory cell corresponding to a bit line BL1 out of bit lines BL1 to BL3. The operation performed in the case of optimizing setting values of setting internal states of the semiconductor integrated circuit (a mode setting value of a microcomputer LSI, a clock frequency of an LSI for PLL (Phase-Locked Loop), and the like) within a predetermined range while providing conditions will be described. In an initial state where writing operation is not performed, all of the flash memory cells in the first to third memory cores MC1 to MC3 and the flash memory cells C1 and C2 of the pointer memory PM are set to the state of "1".

A case of writing data "11111010" as a first setting value will be described. Pointer values (C1, C2) stored in the pointer memory PM are (1, 1). The pointer values are input to the decoder 11 for pointer via the sense amplifiers SA1 and SA2 and the data latches DL1 and DL2. The high-level selection signal S1 is output from the AND gate AND1, and the low-level selection signals S2 and S3 are output from the AND gates AND2 and AND3. Since writing operation is performed, the write switch SW1 is accordingly made conductive and the read switch SW2 is made non-conductive. The high-level selection signal S1 is input to the gate of the transistor Tr11, the transistor Tr11 is made conductive, and the high voltage VH for writing is applied to the decoder DC1 for writing.

By the column selector 18 for writing memory core, transistors in the write decoder DC1 according to the input data "11111010" are made conductive. The bit line BL1 is selected by the row selector 16 for memory core, and a high voltage is applied to the bit line BL1 by the row driver 17 for a memory core. By the operation, at the time of writing data, the first memory core MC1 is selected as a memory core to be written by the pointer values (1, 1). The data "111110110" is written in flash memory cells corresponding to the bit line BL1 of the first memory core MCI.

A case of reading data written in the first memory core MC1 will be described. Since the pointer values (C1, C2) stored in the pointer memory PM are (1, 1), the high-level selection signal S1 is output from the decoder 11 for pointer. Since the reading operation is performed, accordingly, the write switch SW1 is made nonconductive and the read switch SW2 is made conductive. Therefore, the high-level selection signal S1 is input to the first selector SS1 and the transistors are made conductive, so that the data "11111010" written in the first memory core MCI is input to the sense amplifier 15 for reading. Consequently, at the time of reading data, the first memory core MC1 is selected as a memory core from which data is to be read by the pointer values (1, 1). From the sense amplifier 15 for reading, the data "11111010" is output as read data DOUT. The read data DOUT is used as a parameter for controlling the operation of an LSI or the like as one of various setting values.

It is understood from the above that the pointer 2 selects the first memory core MC1 as the same memory core to which data is to be written and a memory core from which data is to be read in accordance with the pointer value written in the pointer memory PM. When the first memory core MCI is selected as a memory core to which data is to be written, the switch unit 4 makes a path between the first memory core MC1 and the high voltage VH for writing conductive. When the first memory core MCI is selected as a memory core from which data is to be read, the switch unit 4 makes a data output path from the first memory core MCI conductive.

A case of rewriting the data "11111010" written in the first memory core MCI for the first time to obtain data "10101010" as the second setting value will now be described. In this case, all of data to be written is a predetermined logic value "0", so that the data writing operation can be performed only by a program operation, and an erasing operation is unnecessary. Therefore, the data writing is not regulated, so that data can be overwritten on the first memory core MC1 as the same memory cell, and the pointer values (C1, C2) of the pointer memory PM may remain as (1, 1). In a manner similar to the writing operation, the data "10101010" is overwritten on the flash memory cell corresponding to the bit line BL1 of the first memory core MC1. Since the detailed writing operation is as described above, the description will not be repeated here.

The case of rewriting the data "10101010" written on the first memory core MCI for the second time to data "01010101" as the third setting value will now be described. In this case, the data writing operation includes writing of the logic value "1" opposite to the predetermined logic value, so that erasing operation is necessary and data writing is regulated. In the semiconductor memory device 1 according to the invention, in place of performing the erasing operation, an operation of switching a memory core to be selected by rewriting the pointer value stored in the pointer memory PM is performed.

First, the transistor Tr1 is made conductive by the column selector 13 for pointer writing, and the high voltage VH for writing is applied to the flash memory cell C1. A high voltage is applied to the flash memory cells C1 and C2 by the row driver 12 for pointer. In such a manner, the pointer values (C1, C2) stored in the pointer memory PM are rewritten from (1, 1) to (0, 1), thereby selecting the second memory core MC2 (data "11111111") in place of the first memory core MC1.

According to the pointer values (0, 1), the high-level selection signal S2 is output from the AND gate AND2, and the low-level selection signals S1 and S3 are output from the AND gates AND1 and AND3, respectively. According to the operation of writing the third setting value, the write switch SW1 is made conductive, and the read switch SW2 is made nonconductive. The transistor Tr12 is made conductive by the high-level selection signal S2, and the high voltage VH for writing is applied to the decoder DC2 for writing.

By the column selector 18 for writing memory core, transistors in the decoder DC1 for writing according to the input data are made conductive. The bit line BL1 is selected by the row selector 16 for memory core and a high voltage is applied to the bit line BL1 by the row driver 17 for a memory core. The flash memory cells corresponding to the bit line BL1 in the second memory core MC2 are rewritten from the data "11111111" to the data "01010101".

In short, at the time of writing data to a nonvolatile memory cell in the selected first memory core MC1, when all of data to be written by the data writing operation is the predetermined logic value "0", the data in the first memory core MC1 is overwritten. On the other hand, when at least one bit of the data to be written by the data writing operation is the logic value "1" which is the opposite to the predetermined logic value, the flash memory cell C1 in the pointer 2 is rewritten to "0" and, after that, the data writing operation is performed on the second memory core MC2 to be selected by the pointer 2 subjected to the rewriting. By switching the memory core to be selected from the first memory core MC1 to the second memory core MC2 (initial value "11111111") by the pointer 2, pseudo erasing operation can be performed. It can be regarded that, after the erasing operation is performed, the data writing operation is newly executed.

The case of reading the data "01010101" written in the second memory core MC2 will be described. Since the pointer values stored in the pointer memory PM are (0, 1), the high-level selection signal S2 is output from the decoder 11 for pointer. According to the data reading operation, the write switch SW1 is made nonconductive, and the read switch SW2 is made conductive. The high-level selection signal S2 is input to the second selector SS2 and each of the transistors is made conductive, so that data written in the second memory core MC2 is input to the sense amplifier 15 for reading. From the sense amplifier 15 for reading, the data "01010101" is output as the read data DOUT. The read data DOUT is used as various setting values for controlling the operation of the semiconductor integrated circuit or the like. As described above, also at the time of the data reading operation, the second memory core MC2 is selected by the pointer 2.

To select the third memory core MC3 as an object of an access control, it is sufficient to replace the pointer values (C1, C2) stored in the pointer memory PM with (0,0) in a manner similar to the above. The detailed rewriting operation will not be repeated here. The pointer memory PM has at least memory cells (two bits) of the amount of bits (=the number of memory cores−1), so that the semiconductor memory device 1 can be rewritten at least by the number corresponding to the number of memory cores (three).

As specifically described above, according to the semiconductor memory device 1 of the first embodiment, in the case of using the nonvolatile memory cell in which data writing is regulated to the predetermined logic value, the logic value opposite to the predetermined logic value can be falsely written. Therefore, while making a circuit (a circuit for erasing operation or the like) necessary to prevent the data writing from being regulated to the predetermined logic value unnecessary, a writing operation similar to that on a nonvolatile memory in which data writing is not regulated can be performed. In the case where a large circuit area is occupied by the circuit for erasing operation or the like, by making the circuit unnecessary, the circuit size of the semiconductor memory device can be reduced.

For example, in the flash memory, to construct a memory cell on which the erasing operation (operation of writing "1" onto the logic value "0") can be performed, a negative voltage applying circuit requiring a large circuit area due to its capacitance is necessary. However, by employing the invention, while making the negative voltage applying circuit unnecessary, the erasing operation can be performed falsely. In the case where the area occupied by the pointer and the plural memory cores in the invention is smaller than the area occupied by the negative voltage applying circuit, the circuit size of the semiconductor memory device can be reduced. Particularly, the smaller the number of rewriting times of the nonvolatile semiconductor memory device is, the smaller the number of memory cores to be prepared is. The smaller the storage capacity of the semiconductor memory device is, the smaller the area of the memory cores is. Therefore, since the area occupied by the memory cores becomes smaller than that occupied by the negative voltage applying circuit, a conspicuous effect of reduction in the circuit size by making the negative voltage applying circuit unnecessary is produced.

As a nonvolatile semiconductor memory device with small storage capacity and the small number of rewriting times, a memory for storing various setting values in a semiconductor integrated circuit can be mentioned.

Figure 2:
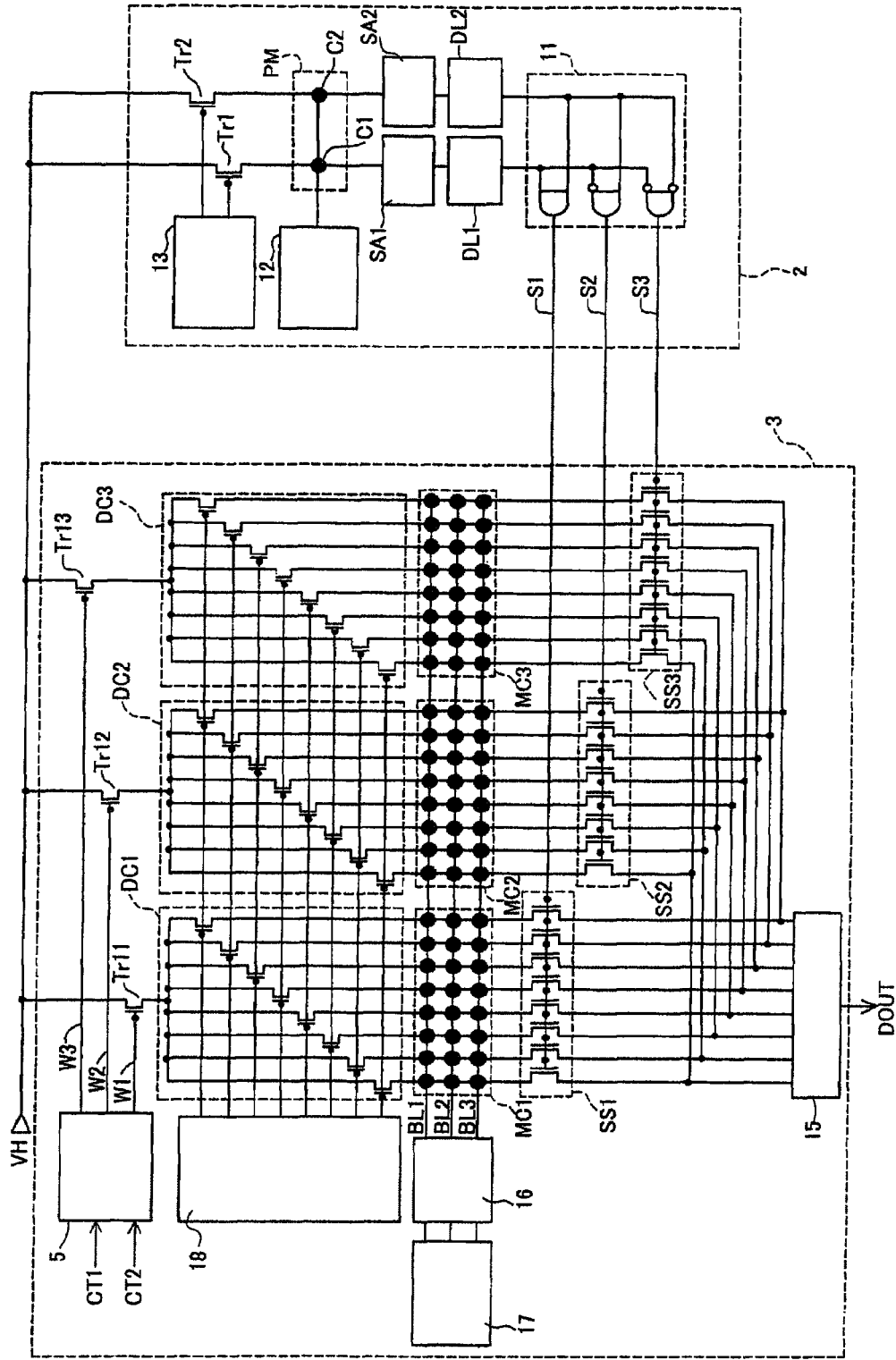
FIG. 2 is a diagram showing a semiconductor memory device 1a according to a second embodiment.

A second embodiment of the invention will be described with reference to FIG. 2. FIG. 2 shows a semiconductor memory device 1a according to the second embodiment. The semiconductor memory device 1a has a configuration similar to the semiconductor memory device 1 of the first embodiment except that a memory core selector 5 for writing is provided and the switch unit 4 is not provided. To the memory core selector 5 for writing, control signals CT1 and CT2 for selecting a memory core to which data is to be written are input. Memory core selection signals W1 to W3 for writing which are output from the memory core selector 5 for writing are input to the gates of the transistors Tr11 to Tr13, respectively. Selection signals S1 to S3 output from the decoder 11 for pointer are input to the first to third selectors SS1 to SS3, respectively. The other configuration is similar to that of the semiconductor memory device 1 of the first embodiment, so that the description will not be repeated here.

The operation of the semiconductor memory device 1a will be described. In the second embodiment, plural candidate values for setting the internal state of an LSI or the like are preliminarily written in the memory cores MC1 to MC3 and any of the candidate values can be selected as a setting value by the pointer 2. The pointer 2 functions as a read pointer for selecting a memory core from which data is to be read.

The operation of writing first to third candidate values in the memory cores will be described. In the case of writing the first candidate value into the first memory core MC, control signals (CT1, CT2) to be input to the memory core selector 5 for writing are set as (1, 1). From the memory core selector 5 for writing, the memory core selection signal W1 for writing at the high level and the memory core selection signals W2 and W3 for writing at the low level are output. The high-level selection signal W1 is input to the gate of the transistor Tr11, the transistor Tr11 is made conductive, and the high voltage VH for writing is applied to the decoder DC1 for writing. Transistors in the decoder DC1 for writing according to the input data are made conductive by the column selector 18 for memory core writing, the bit line BL1 is selected by the row selector 16 for memory core, and a high voltage is applied to the bit line BL1 by the row driver 17 for a memory core. By the above operations, the first candidate value is written into the first memory core MC1.

In the case of writing the second and third candidate values into the second and third memory cores MC2 and MC3, respectively, the control signals (CT1, CT2) are set to (0,1) and (0,0), respectively. By performing operation similar to writing of the first candidate, the second and third candidate values are written in the second and third memory cores MC2 and MC3, respectively. The details of the writing operation will not be repeated here.

An operation of selecting any of the first to third candidate values written in the first to third memory cores MC1 to MC3 and using the selected candidate value as a setting value at the time of a test or the like of the semiconductor integrated circuit will be described. Since the pointer values (C1, C2) of the pointer memory PM in the initial state are (1, 1), the high-level selection signal S1 is output from the decoder 11 for pointer. When the high-level selection signal S1 is input to the first selector SS1, the first candidate value written in the first memory core MC1 is output as the read data DOUT via the sense amplifier 15 for reading.

When a function test is performed on the semiconductor integrated circuit on the basis of the first candidate value and it is determined that the first candidate value is improper as the setting value, an operation of switching the setting value to the second candidate value is performed. The transistor Tr1 is made conductive by the column selector 13 for pointer writing and the high voltage VH for writing is applied to the flash memory cell C1. By the row driver 12 for pointer, a high voltage is applied to the flash memory cells C1 and C2. By rewriting the pointer values (C1, C2) to (0,1), the memory core selected as a memory core from which data is read is switched from the first memory core MC1 to the second memory core MC2. According to the pointer values (0,1), the high-level selection signal S2 is output from the decoder 11 for pointer. When the high-level selection signal S2 is input to the second selector SS2, the second candidate value written in the second memory core MC2 is output as read data DOUT via the sense amplifier 15 for reading.

Similarly, when it is found that the second candidate value written in the second memory core MC2 is improper, operation of reading the third candidate value written in the third memory core MC3 by rewriting the pointer value (C1,C2) to (0,0) is performed. By sequentially incrementing the pointer value of the pointer memory PM in such a manner, the operation of reading candidate values can be performed while selecting the first memory core MC1 to the third memory core MC3 in an irreversible predetermined order.

As specifically described above, in the semiconductor memory device 1a according to the second embodiment, the setting value for setting the internal state of the semiconductor integrated circuit can be selected from plural candidate values within a predetermined range. Specifically, candidate values are preliminarily written in plural memory cores and, by using the pointer 2 as a read pointer, the candidate values can be selected and read from the memory cores in an irreversible predetermined order. Consequently, an operation of writing of a candidate value into a memory core and an operation of reading the setting value from a memory core can be performed separately.

Therefore, in the case where the candidate values are determined, by preliminarily writing the candidate values in the memory cores, a work for writing the setting value each time when a condition is provided can be omitted. For example, in the case of writing some kinds of candidate values of various setting values of a semiconductor integrated circuit at the time of shipment of the semiconductor integrated circuit having the semiconductor memory device 1a from a factory and selecting a setting value from the candidate values in accordance with use conditions of the user, it is sufficient for the user to perform a selecting operation. Consequently, an advantage that the time required for writing can be shortened is obtained.

Figure 3:
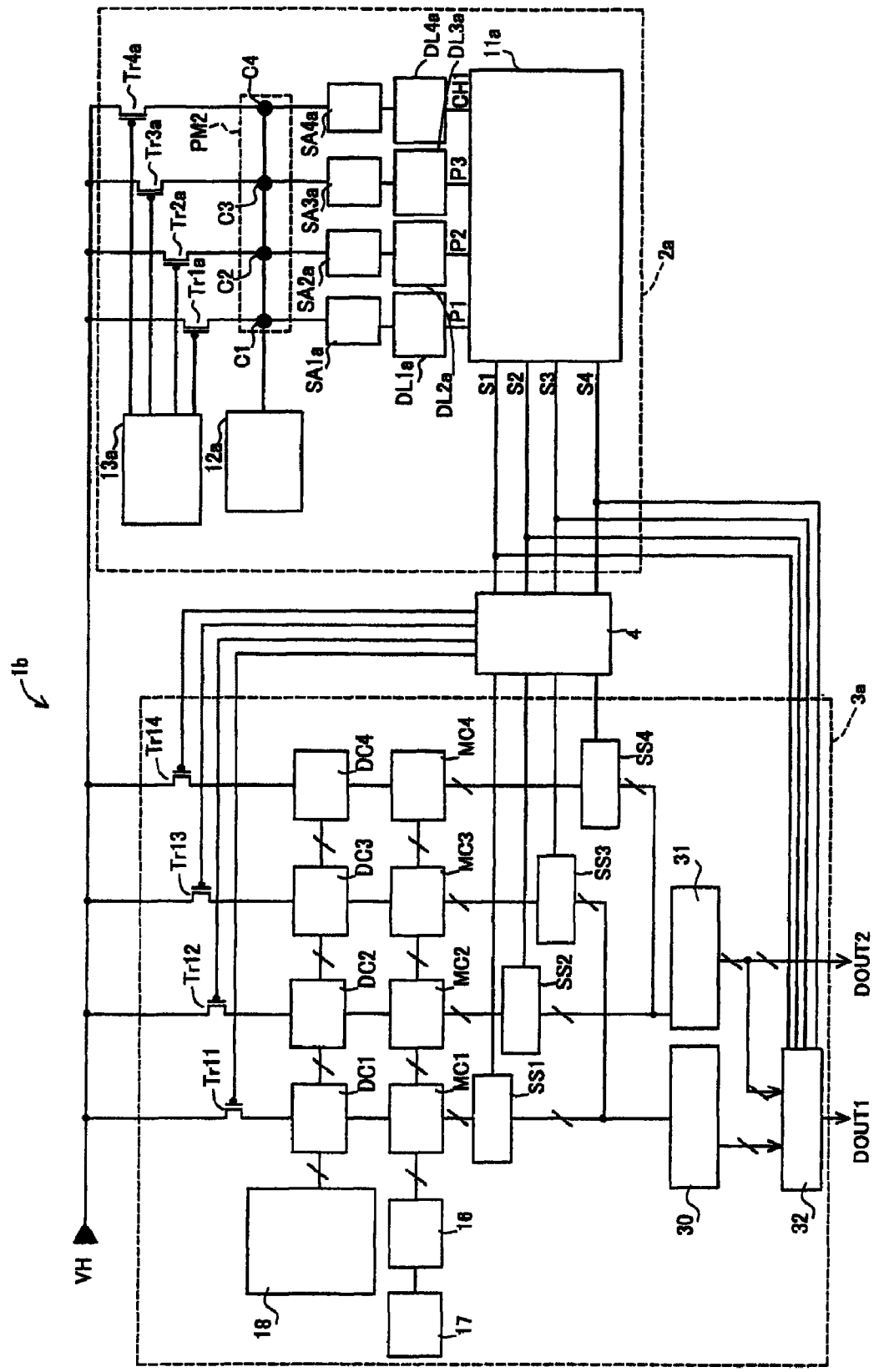
FIG. 3 is a diagram showing a semiconductor memory device 1b according to a third embodiment.

A third embodiment of the invention will be described with reference to FIGS. 3 and 4. FIG. 3 shows a semiconductor memory device 1b according to the third embodiment. The semiconductor memory device 1b is a device capable of varying the bit width of data handled between eight bits and 16 bits. The semiconductor memory device 1b has a pointer 2a and a memory cell unit 3a in place of the pointer 2 and the memory cell unit 3 of the first embodiment. The pointer 2a has a pointer memory PM2, a column selector 13a for pointer writing, a row driver 12a for pointer, transistors Tr1a to Tr4a, sense amplifiers SA1a to SA4a, data latches DL1a to DL4a, and a decoder 11a for pointer. The pointer memory PM2 has flash memory cells C1 to C4. The flash memory cells C1 to C3 are cells for storing pointer values, and the flash memory cell C4 is a cell for storing a bit width switching signal. The flash memory cells C1 to C4 are connected to the decoder 11a for pointer via the sense amplifiers SA1a to SA4a and the data latches DL1a to DL4a. To the decoder 11a for pointer, pointer memory signals P1 to P3 and a bit width switching signal CH1 are input. Selection signals S1 to S4 output from the decoder 11a for pointer are input to the switch unit 4 and an output selector 32.

Different from the memory cell unit 3 of the first embodiment (FIG. 1), the memory cell unit 3a has a first read sense amplifier 30, a second read sense amplifier 31, an output selector 32, a transistor Tr14, a decoder DC4 for writing, a fourth memory core MC4, and a fourth selector SS4. The output terminals of the first and third selectors SS1 and SS3 are connected to the first read sense amplifier 30, and the output terminals of the second and fourth selectors SS2 and SS4 are connected to the second read sense amplifier 31. To the output selector 32, output terminals of the first read sense amplifier 30, second read sense amplifier 31, and decoder 11*a* for pointer are connected. The read data DOUT1 is output from the output selector 32, and the read data DOUT2 is output from the second read sense amplifier 31. The other configuration is similar to the semiconductor memory device 1 of the first embodiment, so that the description will not be repeated here.

The operation of the semiconductor memory device 1*b* according to the third embodiment will be described by using FIG. 4. In the case of switching the bit width of data handled to 16 bits, the flash memory cell C4 is set to "1" and the bit width switch signal CH1 is set to "1". The case where the pointer memory signal P1 is "1" will now be described. At this time, as shown in FIG. 4, the selection signals S1 and S2 are at the high level and the selection signals S3 and S4 are at the low level. Therefore, the pointer 2*a* performs an operation of selecting the first memory core MC1 and the second memory core MC2 as the same memory cores to which data is written and from which data is read in accordance with the pointer value written in the pointer memory PM2.

At the time of writing data, the transistors Tr11 and Tr12 are made conductive by the switch unit 4, data of upper eight bits is written into the first memory core MC1, and data of lower eight bits is written to the second memory core MC2. At the time of reading data, the first selector SS1 and the second selector SS2 are made conductive by the switch unit 4, data of upper eight bits is read to the first read sense amplifier 30, and data of lower eight bits is read to the second read sense amplifier 31. In accordance with the input selection signals S1 to S4, the output selector 32 outputs data input from the first read sense amplifier 30 as read data DOUT1. The second read sense amplifier 31 outputs the read data DOUT2. The read data DOUT1 indicates upper eight bits, and the read data DOUT2 indicates lower eight bits.

The case of performing rewriting so that data written in the first and second memory cores MC1 and MC2 includes the logic value "1" opposite to the predetermined logic value when the bit width of data is 16 bits will be described. At this time, the operation of switching memory cores to be selected from the first and second memory cores MC1 and MC2 to the third and fourth memory cores MC3 and MC4 is performed in place of performing the erasing operation. The switching operation is performed by writing "0" to the flash memory cell C1 in the pointer memory PM2 to set the pointer memory signal P1 to "0". At this time, as shown in FIG. 4, the selection signals S1 and S2 are set to the low level and the selection signals S3 and S4 are set to the high level. Therefore, the pointer 2*a* performs an operation of selecting the third memory core MC3 and the fourth memory core MC4 in which the data "11111111" is held as the same memory cores to/from which data is written/read in place of the first memory core MC1 and the second memory core MC2. After that, new data is written to the third and fourth memory cores MC3 and MC4. Thus, a memory cell on which the erasing operation (operation of writing "1" to the logic value "0") can be performed can be constructed without requiring the negative voltage applying circuit also in the case where the bit width of data is 16 bits.

When the bit width of data to be handled is set to eight bits, it is sufficient to set the flash memory cell C4 to "0" and the bit width switch signal CH1 to "0". At this time, as shown in FIG. 4, it is controlled so that anyone of the selection signals S1 to S4 becomes the high level in accordance with the values of the pointer memory signals P1 to P3. Therefore, the pointer 2*a* performs an operation of selecting any one of the first to fourth memory cores MC1 to MC4 as the same memory core to/from which data is written/read in accordance with the pointer value written in the pointer memory PM2. When the first and third selectors SS1 and SS3 are selected according to the selection signals S1 to S4, the output selector 32 reads data input from the first read sense amplifier 30 and outputs it as the read data DOUT1. On the other hand, when the second selector SS2 and the fourth selector SS4 are selected, data input from the second read sense amplifier 31 is output as the read data DOUT1. The other detailed operations are similar to those of the semiconductor memory device 1 of the first embodiment, so that the description will not be repeated here.

As specifically described above, the semiconductor memory device 1*b* according to the third embodiment can variably handle the bit width of data handled between 16 bits and eight bits. Therefore, also in the case where the bit width of the setting value of the semiconductor integrated circuit is changed, it is sufficient to rewrite the value of the pointer memory PM2 irrespective of a change in a reticle or the like, so that the change can be promptly and flexibly addressed at low cost.

A fourth embodiment of the invention will be described with reference to FIGS. 5 and 6. In the fourth embodiment, a memory core can be selected by a signal other than a pointer value input from the pointer 2*a*. The semiconductor memory device according to the fourth embodiment has a configuration similar to that of the semiconductor memory device 1*b* of the third embodiment except that a decoder 11*b* for pointer shown in FIG. 5 is provided in place of the decoder 11*a* for pointer of the semiconductor memory device 1*b* of the third embodiment. To the decoder 11*b* for pointer, external selection signals I1 to I4 and a pointer switch signal CH2 are input from the outside of the pointer 2*a*, and pointer memory signals P1 to P3 output from the data latches DL1*a* to DL3*a* are also input. Selection signals S1 to S4 are output from the decoder 11*b* for pointer.

Figures 4, 6:
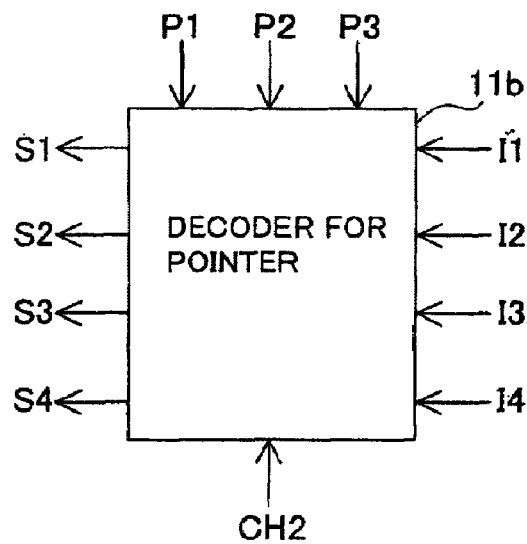
FIG. 4 is a diagram showing operation of the semiconductor memory device 1b.
FIG. 6 is a diagram showing operation of the decoder 11b for a pointer.
Figure 7:
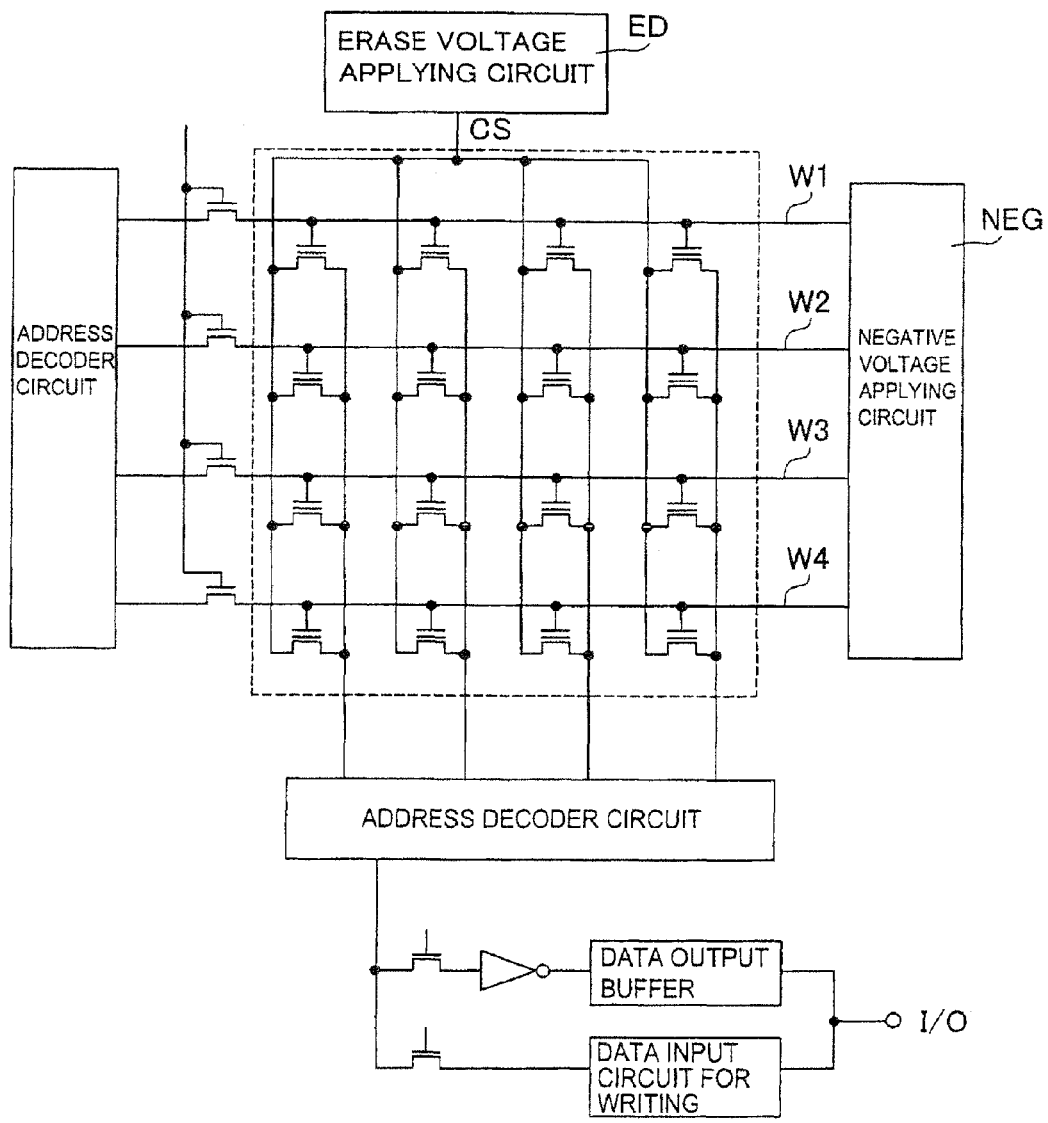
FIG. 7 is an internal block diagram showing a conventional nonvolatile semiconductor memory device.

As shown in the table of FIG. 6, when the pointer switch signal CH2 is "0", the decoder 11*b* for pointer outputs the selection signals S1 to S4 in accordance with the pointer memory signals P1 to P3. Specifically, when the pointer memory signals P1, P2, and P3 are (1, 1, 1), the selection signal S1 is set to the high level. When the pointer memory signals P1, P2, and P3 are (0, 1, 1), the selection signal S2 is set to the high level. Therefore, in a manner similar to the third embodiment, an operation of selecting a memory cell to be subjected to an access control in accordance with the pointer values latched in the flash memory cells C1 to C3 of the pointer memory PM2 is performed.

On the other hand, when the pointer switch signal CH2 is "1", the decoder 11*b* for pointer outputs the selection signals S1 to S4 in accordance with external selection signals I1 to I4. Specifically, when selected signal values are (1, 0, 0, 0), the selection signal S1 is set to the high level and the first memory core MC1 is selected. When the pointer values are (0, 1, 0, 0), the selection signal S2 is set to the high level, and the second memory core MC2 is selected. Therefore, irrespective of the pointer value held in the pointer memory cell in the pointer memory PM2, a memory core to be subjected to access control can be selected by the external selection signals I1 to I4.

When a flash memory cell in which data writing is regulated to a predetermined logic value is used for the pointer memory PM2, selection of a memory core is regulated to the irreversible predetermined order. Consequently, the setting value cannot be reset to the previous setting value and it is difficult to provide a condition. However, as shown in the fourth embodiment, when a memory core to be accessed can be selected irrespective of the value of the pointer memory by an external selection signal, a memory core can be freely selected. Therefore, the setting value can be reset to the previous setting value and a condition can be provided for the setting value. It is sufficient to rewrite a pointer memory so as to select a memory cell in which a setting value obtained under the condition is written by the pointer memory PM2.

Therefore, for example, at the time of function evaluation, a conditioning step of freely selecting a memory core to be accessed by an external selection signal and obtaining a setting value and a setting step of writing the obtained setting value into a pointer memory and holding it can be provided. In this case as well, a circuit for erasing operation and the like can be made unnecessary, so that the circuit size of the semiconductor memory device can be reduced.

Obviously, the invention is not limited to the foregoing embodiments but can be variously improved and modified without departing from the gist of the invention. Although the nonvolatile memory cell used in the embodiments is a flash memory cell on which only programming operation can be performed, the invention is not limited to the nonvolatile memory cell but the nonvolatile memory cell may be, for example, a fuse. Obviously, a fuse is an example of a nonvolatile memory cell in which data writing is regulated to a predetermined logic value. Also in the case of using a fuse, the erasing operation can be falsely performed without requiring the negative voltage applying circuit. Obviously, the effect of reduction in the circuit size by making the negative voltage applying circuit unnecessary can be obtained.

In the nonvolatile memory cell used in the embodiments, a word line is selected according to a pointer memory but the invention is not limited to the embodiment. It is obvious that, in all of the embodiments of the invention, even when the bit line and the word line are interchanged, similar effects can be obtained.

In the semiconductor memory device 1b according to the third embodiment, the bit widths of handled data are set to 16 bits and eight bits. The invention however is not limited to the embodiment. Obviously, the bit width can be changed to 24 bits, 36 bits, and the like in accordance with a setting value stored in the semiconductor memory device. The minimum number of rewritable times is determined by the relation between the bit width and the number of memory cores. For example, in the semiconductor memory device 1b, when data handled has the 8-bit width, rewriting can be performed at least four times which is the same as the number of memory cores. When data handled has 16-bit width, rewriting can be performed at least twice. In the case of increasing read bit width to x bits, 2x bits, 4x bits, when the number of memory cores is constant, the minimum number of rewritable times decreases like y, y/2, y/4, . . . .

In the semiconductor memory device 1a according to the second embodiment, memory cores are selected in irreversible predetermined order of the first to third memory cores MC1 to MC3 and an operation of reading candidate values is performed. However, candidate values different from each other are not always written in the memory cores. At least one candidate value may be written in plural memory cores. A condition providing step of selecting memory cores holding candidate values different from each other in an irreversible predetermined order and selecting a setting value, and a setting step of selecting any one of the candidate values as a setting value in accordance with a test result in the conditioning step may be provided.

For example, a first candidate value may be written in the first and third memory cores MC1 and MC3 and a second candidate value may be written in the second memory core MC2. In this case, a condition providing step of conducting the function test with respect to the first and second candidate values by rewriting the pointer value of the pointer memory PM in order of (1,1) and (0,1) to determine which one of the first and second candidate values is optimum is performed. Subsequently, a setting step of selecting any one of the candidate values as a setting value in accordance with a test result in the condition providing step is performed. In the case where the test result that the second candidate value is optimum is obtained, the pointer value (0, 1) are unchanged and the second candidate value is selected as a setting value. In the case where the test result that the first candidate value is optimum is obtained, the pointer value is rewritten to (0,0) and the first candidate value written in the third memory core MC3 is selected as a setting value. By preliminarily writing candidate values in plural memory cores, selecting the memory cores in the irreversible predetermined order, and reading a candidate value, also in the case of setting various setting values, an optimum candidate value can be selected under a condition.

In the semiconductor memory device 1a according to the second embodiment, the memory cells in the memory cores MC1 to MC3 are pointer memory cells. Obviously, the memory cell may be a ROM to which data can be written only once, and a candidate value can be written in advance.

The switch unit 4 is an example of the selector, and the pointers 2 and 2a are an example of the pointer.

According to the invention, a nonvolatile semiconductor memory device in which data writing is regulated to a predetermined logic value, realizing reduction in the circuit size and reduction in power consumption can be provided. Particularly, in a nonvolatile semiconductor memory device storing a small information amount, typified by a memory for storing setting values provided in a semiconductor integrated circuit, reduction of the circuit size can be achieved more conspicuously.

What is claimed is:

1. A method of controlling a semiconductor memory device having plural memory cores each having nonvolatile memory cells in which data writing is regulated to a predetermined logic value, comprising the steps of,
    at the time of selecting a setting value for setting an internal state from plural candidate values in a predetermined range,
    preliminarily writing the plural candidate values in the plural memory cores, and
    selecting the memory cores in an irreversible predetermined order and performing a reading operation on the selected memory core.

2. The method of controlling a semiconductor memory device according to claim 1,
    wherein the device comprises the plural memory cores in which the same candidate value is written as at least one of the candidate values, and the method comprises:
    a condition providing step of selecting the memory cores holding the candidate values different from each other in the irreversible predetermined order and conducting a test on the basis of the candidate value; and
    a setting step of selecting the memory core having the same value as any one of the candidate values selected according to a result of the test and using the candidate value as the setting value.

* * * * *